US010091896B2

(12) United States Patent
Chu

(10) Patent No.: US 10,091,896 B2
(45) Date of Patent: Oct. 2, 2018

(54) FOLDABLE DISPLAY DEVICE

(71) Applicant: BOE TECHNOLOGY GROUP CO., LTD., Beijing (CN)

(72) Inventor: Shang Chieh Chu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/511,546

(22) PCT Filed: Mar. 28, 2016

(86) PCT No.: PCT/CN2016/077559
§ 371 (c)(1),
(2) Date: Mar. 15, 2017

(87) PCT Pub. No.: WO2016/188220
PCT Pub. Date: Dec. 1, 2016

(65) Prior Publication Data
US 2017/0303414 A1 Oct. 19, 2017

(30) Foreign Application Priority Data

May 28, 2015 (CN) .......................... 2015 1 0284328

(51) Int. Cl.
G06F 1/16 (2006.01)
H05K 5/00 (2006.01)
(Continued)

(52) U.S. Cl.
CPC ......... H05K 5/0226 (2013.01); H05K 5/0017 (2013.01); G09F 9/301 (2013.01)

(58) Field of Classification Search
CPC .... G06F 1/1652; G06F 1/1643; G06F 1/1681; H05K 5/0226; H05K 5/0017
(Continued)

(56) References Cited

U.S. PATENT DOCUMENTS 6,223,393 B1 * 5/2001 Knopf ................... G06F 1/1618
16/366
9,173,287 B1 * 10/2015 Kim ....................... H05K 1/028
(Continued)

FOREIGN PATENT DOCUMENTS

CN 201178431 Y 1/2009
CN 201742658 U 2/2011
(Continued)

OTHER PUBLICATIONS

Written Opinion of the International Searching Authority from corresponding PCT Application No. PCT/CN2016/077559, dated Jul. 5, 2016 (6 pages).
(Continued)

Primary Examiner — Anthony Haughton
(74) Attorney, Agent, or Firm — Harness, Dickey & Pierce, P.L.C.

(57) ABSTRACT

The present disclosure relates to the field of display devices and discloses a foldable display device comprising: a main body structure and a flexible screen provided on a surface of the main body structure; the main body structure includes two flat plate areas and a bending area connecting the two flat plates and making the two flat plate areas have an opening and closing angle of 0 degrees to at least 180 degrees between; the bending area having a minimum bending radius at the time of bending so that the flexible screen attached to the surface of the bending area also has a minimum bending radius, which is greater than a critical bending radius of the flexible screen. The present disclosure allows the flexible screen to have a minimum bending radius when the screen is folded, preventing the flexible screen from being damaged by excessive bending.

13 Claims, 3 Drawing Sheets

(51) Int. Cl.
*H05K 7/00* (2006.01)
*H05K 5/02* (2006.01)
*G09F 9/30* (2006.01)

(58) Field of Classification Search
USPC .............. 361/679.21–679.3, 679.55, 679.56
See application file for complete search history.

(56) References Cited

U.S. PATENT DOCUMENTS

| | | | |
|---|---|---|---|
| 9,506,279 B2* | 11/2016 | Kauhaniemi | G06F 1/1652 |
| 9,710,033 B2* | 7/2017 | Yamazaki | G06F 1/1635 |
| 9,720,447 B2* | 8/2017 | In-Sung | G06F 1/1616 |
| 9,760,126 B2* | 9/2017 | Shin | G06F 1/1652 |
| 2007/0261280 A1 | 11/2007 | Rastegar | |
| 2011/0043976 A1* | 2/2011 | Visser | G09F 9/00 |
| | | | 361/679.01 |
| 2014/0042293 A1* | 2/2014 | Mok | G06F 1/1652 |
| | | | 248/682 |
| 2014/0196254 A1* | 7/2014 | Song | E05D 3/14 |
| | | | 16/302 |
| 2014/0355195 A1* | 12/2014 | Kee | G06F 1/1616 |
| | | | 361/679.27 |
| 2015/0077917 A1 | 3/2015 | Song | |
| 2015/0233162 A1* | 8/2015 | Lee | H04M 1/02 |
| | | | 16/223 |
| 2016/0139634 A1* | 5/2016 | Cho | G06F 1/1652 |
| | | | 361/679.27 |
| 2016/0349802 A1* | 12/2016 | Ahn | G06F 1/1641 |

FOREIGN PATENT DOCUMENTS

| | | |
|---|---|---|
| CN | 103228114 A | 7/2013 |
| CN | 203055363 U | 7/2013 |
| CN | 103927940 A | 7/2014 |
| CN | 104464529 A | 3/2015 |
| CN | 104851365 A | 8/2015 |
| WO | WO-2015028704 A1 | 3/2015 |
| WO | WO-2015030432 A1 | 3/2015 |

OTHER PUBLICATIONS

Office Action from corresponding Chinese Application No. 201510284328.5, dated Dec. 26, 2016 (6 pages).

* cited by examiner

FOLDABLE DISPLAY DEVICE

CROSS-REFERENCE TO RELATED APPLICATIONS

This application is a National Stage of PCT/CN2016/077559 filed Mar. 28, 2016, which claims the benefit and priority of Chinese Patent Application No. 201510284328.5 filed May 28, 2015. The entire disclosures of the above applications are incorporated herein by reference.

TECHNICAL FIELD

Embodiments of the present disclosure relate to the field of display devices, and more particularly to a foldable display device.

BACKGROUND

As shown in FIG. 1, a conventional foldable display device is two flat plates 1 with a flat structure which are connected to each other by two hinges 3 and have an opening and closing angle of 0 degrees to at least 180 degrees. The grooves on the surfaces of the two flat plates 1 are fitted with a flexible touch screen 2 that can be bent, and the bending line of the flexible touch screen 2 approaches the axis of the hinges 3. The bodies of two flat plates of the prior art foldable display device are connected by the hinges 3 to achieve a folding or flattening opening and closing operation, as shown in FIG. 2. At the time of folding, the flexible touch screen in the foldable display device must also be folded, which cannot be achieved yet using the current flexible OLED (organic light-emitting diode) technology, and if the flexible screen is folded by force or bent excessively, this will most likely cause abnormal screen or screen damage.

SUMMARY

(A) Technical Problem to be Solved

It is an object of the present disclosure to provide a foldable display device having a minimum bending radius when the screen is folded, preventing the flexible screen from being damaged by excessive bending.

(B) Technical Solution

In order to solve the above technical problem, the present disclosure provides a foldable display device, comprising: a main body structure and a flexible screen provided on a surface of the main body structure; wherein the main body structure includes two flat plate areas and a bending area connecting the two plate areas and making the two plate areas have an opening and closing angle of 0 degrees to at least 180 degrees; the bending area has a minimum bending radius at the time of bending such that the flexible screen attached to the surface of the bending area also has a minimum bending radius, which is greater than a critical bending radius of the flexible screen.

According to an exemplary embodiment of the present disclosure, the bending area includes a bending body and a bending bracket group provided in the bending body, wherein the bending bracket group includes three or more T-shaped brackets arranged successively, the upper surfaces of the T-shaped brackets are located on the inner side surface of the bending body, and the bracket arms of two adjacent T-shaped brackets are hinged by a hinge.

According to an exemplary embodiment of the present disclosure, a pivot link is provided between the bracket bodies of any two adjacent T-shaped brackets; the pivot link comprises two pivoting rods hinged together, each of the pivoting rods being hinged to a bracket body.

According to an exemplary embodiment of the present disclosure, the opening directions of any two adjacent pivot links are the same or opposite.

According to an exemplary embodiment of the present disclosure, the bending body is made of a soft material.

According to an exemplary embodiment of the present disclosure, the soft material is silica gel or rubber.

According to an exemplary embodiment of the present disclosure, the flexible screen is attached to the inner side surface of the bending area be means of a foam tape.

(C) Beneficial Effects

Embodiments of the present disclosure provide a foldable display device in which the bending area forms a bending radius which is greater than the minimum bending radius of the flexible screen during the folding of the screen, thus preventing the flexible screen from being folded forcibly or bent excessively to avoid damage to the flexible screen caused by excessive bending.

DETAILED DESCRIPTION OF SPECIFIC EMBODIMENTS

Hereinafter, specific embodiments of the present disclosure will be described in further detail with reference to the accompanying drawings and embodiments. The following embodiments are provided to illustrate the disclosure, but are not intended to limit the scope of the disclosure.

It is to be noted that in the description of the present disclosure, "inner side" means a side that engages the flexible screen.

First Embodiment

Figure 1:
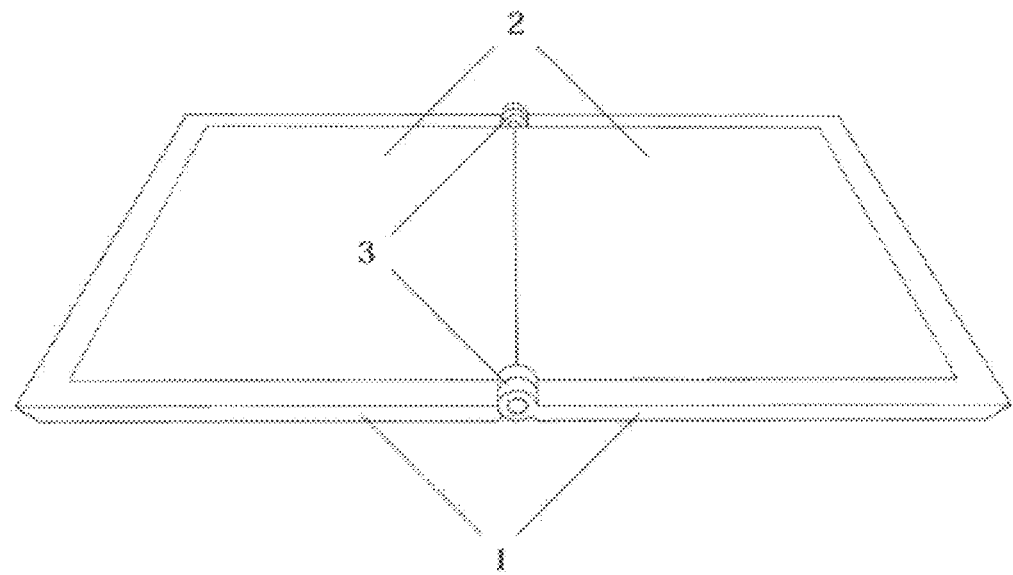
FIG. 1 is an overall structural diagram (open state) of a prior art foldable display device.
Figure 2:
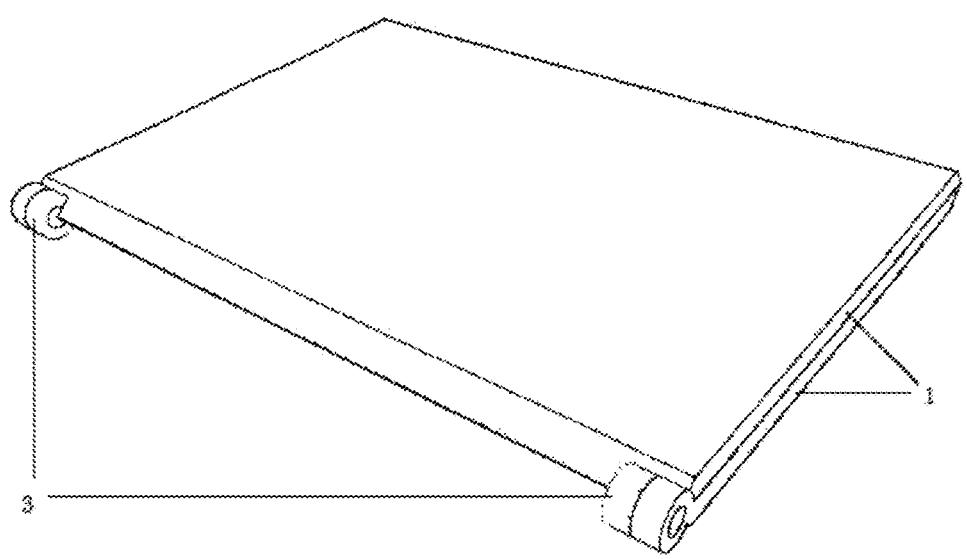
FIG. 2 is an overall structural diagram (folded state) of a prior art foldable display device.
Figure 3:
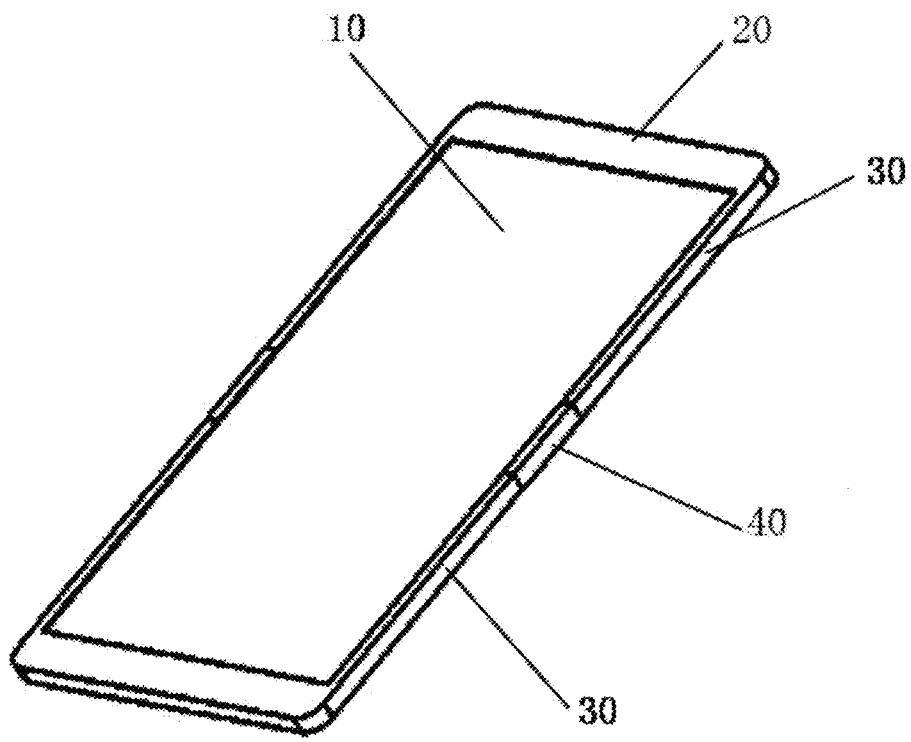
FIG. 3 is an overall structural diagram of a foldable display device of a first embodiment of the present disclosure.
Figure 4:
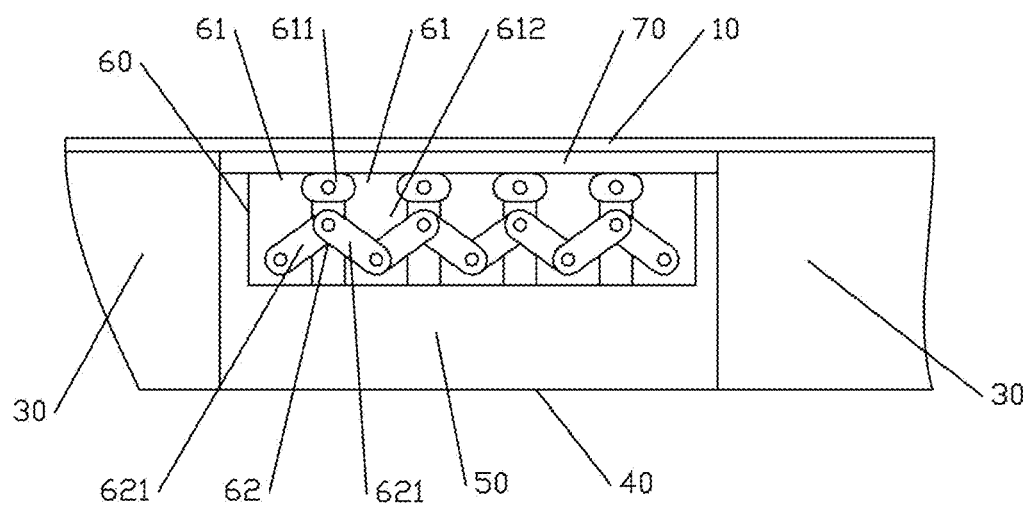
FIG. 4 is an enlarged view of the bending area of the foldable display device of a first embodiment of the present disclosure.

With reference to FIGS. 3 to 4, as shown, the foldable display device includes a main body structure 20 and a flexible screen 10 provided on a surface of the main body structure 20, and the main body structure 20 includes two flat plate areas 30 and a bending area 40 connecting the two flat plate areas 30 and making the two flat plate areas 30 have an opening and closing angle of 0 degrees to at least 180 degrees. The bending area 40 includes a bending body 50 and a bending bracket group 60 provided in the bending body 50. The bending bracket group 60 includes three or more T-shaped brackets 61 arranged successively, and the upper surfaces of the T-shaped brackets are located on the inner side surface of the bending body 50, and the bracket arms 611 of two adjacent T-shaped brackets 61 are hinged by a hinge. Therein the bending body 50 is made of a soft material.

Figure 5:
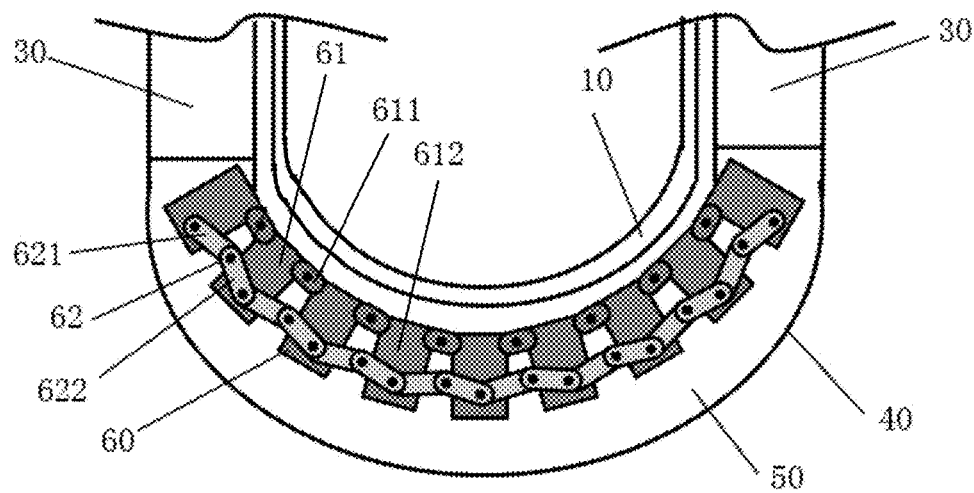
FIG. 5 is an enlarged view (bent state) of the bending area of the foldable display device of a first embodiment of the present disclosure.

As shown in FIG. 5, the bending area 40 of the foldable display device of the present disclosure is provided with a bending bracket group 60 composed of at least three T-shaped brackets 61. In the screen folding process, the bending bracket group 60 constitutes a skeleton of the bending area 40, which will have a minimum bending radius at the time of bending, so that the flexible screen 10 attached to the surface of the bending area also has a minimum bending radius, which is greater than the critical bending radius of the flexible screen (the critical bending radius refers to the bending radius that causes the flexible screen to be damaged), avoiding excessive bending of the flexible screen 10 during the folding process, thus preventing damage to the flexible screen 10 due to excessive bending.

Further, a pivot link 62 is provided between the bracket bodies 612 of any adjacent two T-shaped brackets 61. The pivot link 62 includes two pivoting rods 621 which are hinged together, and each pivoting rod 621 is hinged to a bracket body 612. Referring to FIG. 4, in the present embodiment, the opening directions of any two adjacent pivot links 62 are the same, and the openings of the pivot links 62 in this embodiment are all downward. It should be noted that the openings of the pivot links 62 may also be upward. A pivot link is provided between adjacent T-shaped brackets 61 to ensure that the bending angle between any two T-shaped brackets 61 is not too large to further ensure that the bending radius conforms to the design requirements, avoiding damage to the flexible screen 10.

Further, it is preferable that the soft material is used preferably made of silica gel or rubber, and the bent body made of silica gel or rubber has a low cost.

Further, the flexible screen 10 is attached to the inner side surface of the bending area 40 through a foam tape 70. As the flexible screen is attached to the inner surface of the bending area using a foam tape 70, the foam tape 70 has a tensile property to avoid the problem of the flexible screen stretching when the flexible screen is attached directly, thereby protecting the flexible screen.

The Second Embodiment

Figure 6:
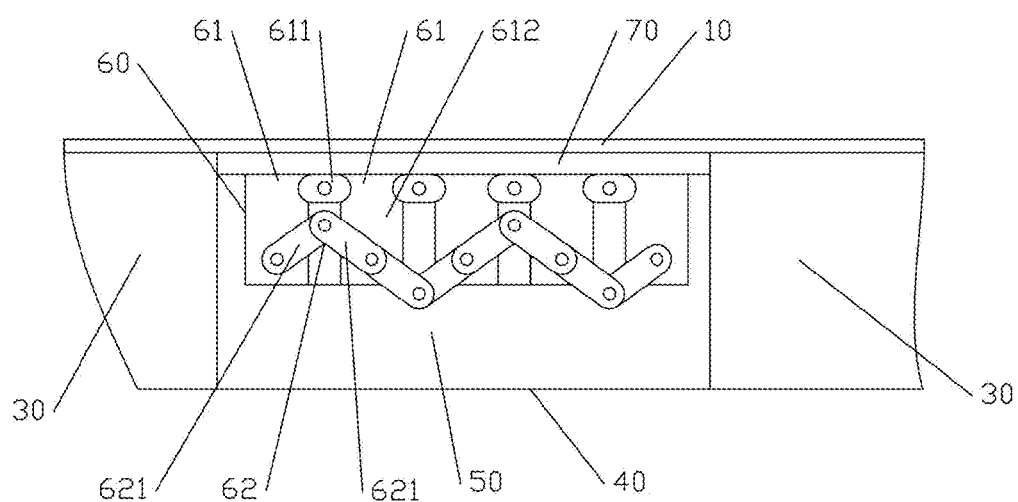
FIG. 6 is an enlarged view of the bending area of the foldable display device of the second embodiment of the present disclosure.

The present embodiment is substantially the same as the first embodiment, except that, as shown in FIG. 6, in the present embodiment, the opening directions of any two adjacent pivot links 62 are opposite.

The foregoing is intended only as preferred embodiments of the present disclosure and is not intended to be limiting of the disclosure, and any modifications, equivalent substitutions, improvements, and the like within the spirit and principles of the disclosure are intended to be included within the scope of the present disclosure within the scope of protection.

The invention claimed is:

1. A foldable display device, comprising:
a main body structure; and
a flexible screen on a surface of the main body structure;
wherein the main body structure includes two flat plate areas and a bending area connecting the two flat plate areas so the two flat plate areas have an opening and closing angle of 0 degrees to at least 180 degrees;
wherein the bending area includes a bending body and a bending bracket group positioned in the bending body, the bending bracket group includes three or more T-shaped brackets arranged successively, a horizontal bar of each T-shaped bracket includes two bracket arms, a vertical bar of each T-shaped bracket is a bracket body, upper surfaces of the T-shaped brackets are located on an inner side surface of the bending body, and the bracket arms of two adjacent T-shaped brackets are hinged by a first hinge; and
wherein a pivot link is positioned between the bracket bodies of any two adjacent T-shaped brackets, the pivot link includes two pivoting rods hinged together by a second hinge at one end of each of the two pivoting rods, and each of the two pivoting rods are hinged to one of the bracket bodies at the other end of said pivoting rod by a third hinge.

2. The foldable display device according to claim 1, wherein opening directions of any two adjacent pivot links are the same.

3. The foldable display device according to claim 1, wherein the bending body includes a soft material.

4. The foldable display device according to claim 3, wherein the soft material is silica gel or rubber.

5. A foldable display device according to claim 1, wherein the flexible screen is attached to the inner side surface of the bending area by a foam tape.

6. The foldable display device according to claim 2, wherein the bending body includes a soft material.

7. The foldable display device according to claim 6, wherein the soft material is silica gel or rubber.

8. A foldable display device according to claim 2, wherein the flexible screen is attached to the inner side surface of the bending area by a foam tape.

9. A foldable display device according to claim 3, wherein the flexible screen is attached to the inner side surface of the bending area by a foam tape.

10. A foldable display device according to claim 4, wherein the flexible screen is attached to the inner side surface of the bending area by a foam tape.

11. A foldable display device according to claim 6, wherein the flexible screen is attached to the inner side surface of the bending area by a foam tape.

12. A foldable display device according to claim 7, wherein the flexible screen is attached to the inner side surface of the bending area by a foam tape.

13. The foldable display device according to claim 1, wherein opening directions of any two adjacent pivot links are opposite.

* * * * *